United States Patent [19]
Ohkubo

[11] Patent Number: 5,811,858
[45] Date of Patent: Sep. 22, 1998

[54] SEMICONDUCTOR INTEGRATED CIRCUIT DEVICE HAVING GATE OR ACTIVE AREA PATTERNED TO ALLOW FOR MISALIGNMENT

[75] Inventor: Hiroaki Ohkubo, Tokyo, Japan

[73] Assignee: NEC Corporation, Tokyo, Japan

[21] Appl. No.: 610,309

[22] Filed: Mar. 4, 1996

[30] Foreign Application Priority Data

Mar. 6, 1995 [JP] Japan ................................ 7-070410

[51] Int. Cl.⁶ .......................... H01L 27/11; H01L 27/092
[52] U.S. Cl. ......................... 257/369; 257/903; 257/904; 257/351; 257/69
[58] Field of Search .................. 257/903, 904, 257/351, 369, 69

[56] References Cited

U.S. PATENT DOCUMENTS

| | | | |
|---|---|---|---|
| 4,724,530 | 2/1988 | Dingwell | 365/156 |
| 5,060,035 | 10/1991 | Nishimura et al. | 257/351 |
| 5,166,763 | 11/1992 | Wada et al. | 257/382 |

OTHER PUBLICATIONS

"16Mbit SRAM Cell Technologies for 2.0V Operation", H. Ohkubo et al, 1991, IEDM, pp. 17.5.1–17.5.4.

"A Split Wordline Cell for 16Mb SRAM Using Polysilicon Sidewall Contacts", Kazuo Itabashi et al, 1991, IEDM, pp. 17.4.1–17.4.4.

"Center Wordline Cell: A New Symmetric Layout Cell for 64 Mb SRAM", I. Naiki et al, 1993, IEDM, pp. 33.3.1–33.3.4.

"A Stacked Split Word–Line (SSW) cell for low voltage operation large capacity, high speed SRAMs", Shuji Ikeda et al, 1993 IEDM, pp. 33.1.1–33.1.4.

*Primary Examiner*—Mahshid D. Saadat
*Assistant Examiner*—John Guay
*Attorney, Agent, or Firm*—Laff, Whitesel, Conte & Saret, Ltd.

[57] ABSTRACT

With regard to paired drive transistors, the shape of an active area is (point or line) symmetrical to a channel area in the vicinity of the channel area. With regard to paired transfer transistors, likewise, the shape of a word line is (point or line) symmetrical to the channel area in the vicinity thereof. With this structure, even if a gate electrode (word line) should be misaligned, therefore, the shapes of the channel areas of the paired transistors would become identical, so that there would be no difference between characteristics.

4 Claims, 14 Drawing Sheets

SEMICONDUCTOR INTEGRATED CIRCUIT DEVICE HAVING GATE OR ACTIVE AREA PATTERNED TO ALLOW FOR MISALIGNMENT

BACKGROUND OF THE INVENTION

1. Field of the Invention

The present invention relates to a semiconductor integrated circuit device, and, more particularly, to a semiconductor integrated circuit device having a layout pattern which prevents the uniform circuit characteristics over the entire wafer from being deteriorated even if a positional misalignment occurs in the fabrication of the device.

2. Description of the Related Art

Conventionally, a semiconductor integrated circuit device uses multiple pairs of field effect transistors (hereinafter referred to as "paired transistors") in a sense amplifier circuit in a memory device and a memory cell or the like in a static random access memory (SRAM) as well as a flip-flop circuit. The difference in characteristics of those paired transistors influences the variation in the yields, performances and characteristics of integrated circuits.

With regard to the memory cells of an SRAM, prior art will now be described referring to FIGS. 1A, 1B, 2A, 2B and 3 to 5.

FIG. 1A presents a circuit diagram of a resistor-load type SRAM cell. This SRAM cell comprises a single flip-flop, which includes two drive transistors Qd1 and Qd2, and two load elements R1 and R2, and two transfer transistors Qt1 and Qt2.

In a cell array, the transfer transistors Qt1 and Qt2 are respectively connected to the data line DL1 and word line WL1 and to the data line DL2 and word line WL2 at the respective intersections between the one set of complementary data liens DL1 and DL2 and one set of word lines WL1 and WL2. The drive transistors Qd1 and Qd2 in the cell have source terminals connected to a ground line $V_{SS}$. The drain terminal of the drive transistor Qd1 is connected at a cell node N1 to one end of the source terminal of the transfer transistor Qt1 and one end of a high-resistance element R1, while the drain terminal of the drive transistor Qd2 is connected at a cell node N2 to one end of the source terminal of the transfer transistor Qt2 and one end of a high-resistance element R2.

The gate terminal of the drive transistor Qd1 is connected to the node N2, and the gate terminal of the drive transistor Qd2 to the node 1. The other ends of the high-resistance elements R1 and R2 are connected to a voltage supply $V_{CC}$. Accordingly, the drive transistors Qd1 and Qd2 and the load elements R1 and R2 constitute a flip-flop. The drive transistors Qd1 and Qd2 and the transfer transistors Qt1 and Qt2 in the illustrated example are all constituted of n channel MOS transistors.

In accordance with the two stable states of the flip-flop as a bistable circuit, the SRAM cell stores the state as data "1" when the node N1 is at a high level and the node N2 is at a low level, and stores the state as data "0" when the node N1 is at a low level and the node N2 is at a high level.

FIGS. 2A and 2B exemplify the layout of a conventional SRAM unit cell in a plan view. While FIGS. 2A and 2B present plan views of the layouts of an MOSFET section and a high-resistance element section, respectively, the high-resistance element section (FIG. 2B) is actually laid over the MOSFET section (FIG. 2A). Cells adjacent to this unit cell are equivalent to the unit cell mirror-reflected with respect to the long side and short side, respectively. Therefore, the adjoining cells share contact holes half of which are illustrated.

The drive transistors Qd1 and Qd2 have source areas connected via contact holes 20 to a ground line 10, and drain areas connected to the source areas of the transfer transistor Qt1 and Qt2, respectively, the drain areas sharing an $n^+$ type diffusion layer 8. The source and drain areas ($n^+$ diffusion layer 8) and channel areas of the drive transistors Qd1 and Qd2 and the transfer transistors Qt1 and Qt2 are formed in an active area 26 defined by a field oxide film. This $n^+$ type diffusion layer 8 is connected to the gate electrodes 5 of drive transistors Qd1 and Qd2 via direct contacts 16. Further, polycrystalline silicon high resistors 12 (R1 and R2) are connected via contact holes 18 to the gate electrodes 5.

The resistances of the polycrystalline silicon layers adjacent to each polycrystalline silicon high resistor 12 are reduced by impurity injection, and one of the polycrystalline silicon layers serves as a voltage supply line 13. One of the source and drain areas of the transfer transistor Qt1 and one of the source and drain areas of the transfer transistor Qt2 are connected to complementary data lines 15 (DL1 and DL2) via contact holes 19. The gate electrodes of the transfer transistors Qt1 and Qt2 also serve as word lines 22 (WL1 and WL2).

To ensure a small cell size in this type of memory cell, the pattern of the active area that defines the source and drain areas and the channel area and the gate electrode pattern are not entirely perpendicular to each other, but one of the patterns is bent in the other part than their intersecting portion. To secure the balance of the flip-flop in the cell, the pairs of the drive transistors, load elements and transfer transistors are designed to have the same gate length, the same gate width, the same resistor length and the same resistor width according to this prior art. Furthermore, every paired elements are arranged symmetrical with respect to the center of the memory cell.

FIG. 3 presents a cross-sectional view along the line A–A' in FIGS. 2A and 2B. A p type well 2 with an impurity concentration of approximately $10^{16}$ to $10^{17}$ cm$^{-3}$ is formed in the memory-cell forming area on an n type silicon substrate 1 with an impurity concentration of approximately $10^{15}$ cm$^{-3}$, and a field oxide film 3 of 200 to 500 nm thick is formed in the device isolation area on the surface of the well 2 by selective oxidation. Formed in the device area in the substrate surface via a gate oxide film 4 of 5 to 20 nm thick is the three-layer gate electrode 5 which consists of a n type polycrystalline silicon film 5a of 50 to 200 nm thick, a tungsten silicide film 5b of 10 to 20 nm thick and a silicon film 5c of 50 to 100 nm thick. A side wall 6 of an oxide film is provided on the sides of the gate electrode 5.

The silicon film 5c on the silicide film 5b is provided to protect the silicide film 5b from being damaged by the etch-back process at the time of the later formation of the side wall or by dry etching at the time of the subsequent opening of the contact hole.

The $n^+$ type diffusion layer 8 with an impurity concentration of approximately $10^{20}$ to $10^{21}$ cm$^{-3}$ is formed by ion injection with the gate electrode 5 and side wall 6 as masks, and an $n^-$ type diffusion layer 7 with an impurity concentration of $10^{17}$ to $10^{18}$ cm$^{-3}$ is formed directly below the side wall 6 in connection with the $n^+$ type diffusion layer 8.

The ground line 10 of a tungsten silicide film with a thickness of 150 to 300 nm is formed via an insulating film 9 over the gate electrode 5, and the polycrystalline silicon high resistor 12 with a thickness of 50 to 200 nm and the voltage supply line 13 are formed via an insulating film 11 over the ground line 10. Formed over those resistor 12 and voltage supply line 13 via an insulating film 14 is the data line 15 made of aluminum. The gate electrode 15 (a word line 21) is connected to an n⁺ type diffusion layer 17 by the direct contact 16, the ground line 10 is connected to the n⁺ type diffusion layer 8 via the contact hole (contact hole 20: see FIGS. 2A and 2B), and the polycrystalline silicon high resistor 12 is connected to the gate electrode 5 via the contact hole 18. The data line 15 is connected to the n⁺ type diffusion layer 8 via the contact hole 19.

When a positional misalignment occurs in the pattern positioning in the fabrication process, there occurs some difference between the characteristics of the paired transistors in the conventional memory cells using field effect transistors, causing the flip-flop to become unbalanced. Therefore, the stability of the cell operation cannot be ensured.

FIG. 4 is a plan layout diagram showing three cells, each having the pattern in FIG. 2A, aligned along the short side. In the illustrated example, the gate electrode 5 and the word line 22 are shifted in the X direction with respect to the active area 26. The intrinsic gate pattern (word line pattern) which has not such a shift is also illustrated in broken lines. Channel areas 39 and 40 of one pair of drive transistors and channel areas 41 and 42 of one pair of transfer transistors in each cell are formed as hatched in the diagram.

In this case, as illustrated, the channel areas of the pair of drive transistors differ from each other, causing differences in the threshold value and ON current. The same is true of the pair of transfer transistors. The degrees of the characteristic differences vary depending on how great the positional misalignment is. When the degree of the positional misalignment differs over the wafer surface or between wafers, therefore, the characteristics of the paired transistors differ from each other.

FIG. 5 illustrates the gate electrode 5 and word line 22 turned around a given point in the wafer in the direction of the arrows so that they are shifted with respect to the active area 26. In this case too, there are differences in shape between channel areas 43 and 44 and channel areas 45 and 46 at the hatched portions, resulting in differences between the characteristics of the paired drive transistors and between those of the paired transfer transistors. Moreover, because the degree of the difference between the shapes of the channel areas of the paired transistors varies depending on the distance from the center of the rotation, a variation would occur in the characteristics of the paired transistors depending on the position on the wafer.

When there is a great difference between the characteristics of those paired transistors, the unbalance of the two stable states of the flip-flop in the SRAM cell becomes greater, and one of the stabilities is impaired. It is therefore likely that data is inverted (destroyed) at the time of reading data or causing external noise. When the supply voltage is low, in particular, this phenomenon becomes prominent, deteriorating the margin of the supply voltage of the SRAM cell.

When the size of the positional misalignment is not scaled in the same way as the miniaturization of devices, the difference between the characteristics of the paired transistors increases in relative to the transistor characteristics. Thus, the stability of the cell, which is delicately dependent on the difference between the characteristics of the paired transistors, is considerably impaired in the case of finer patterning.

The degrees of the characteristic differences vary depending on the degree of the positional misalignment over the wafer surface or between wafers. As the characteristics and yield of an SRAM chip are determined by the difference between the characteristics of the paired transistors in the chip in the worst case, the yield would drop when the characteristic difference becomes greater.

SUMMARY OF THE INVENTION

Accordingly, it is an object of the present invention to provide a semiconductor integrated circuit device which is designed to prevent the occurrence of a variation in characteristics between paired transistors even when a positional misalignment occurs during fabrication to thereby ensure high operation stability and high yield.

To achieve the above object, according to this invention, there is provided a semiconductor integrated circuit device comprising at least one pair of field effect transistors, each having a gate electrode and an active semiconductor layer area having a channel area and source and drain areas and intersecting the gate electrode. A planar shape of the channel area changes from a rectangular shape to another shape when the gate electrode and the active semiconductor layer area are formed with relative positions thereof being misaligned. The shapes of the channel areas of both transistors are identical to each other or mirror images of each other when the positional misalignment is occurred.

One of said gate electrode and said active semiconductor layer area may be formed linearly in a vicinity of said channel area, and the other one may have a side connecting an inherent side for defining an inherent channel area at an angle of other than 180 degrees at a portion where said former side contacts said inherent channel area, and have a shape point symmetrical or line symmetrical to a center or a center line of said inherent channel area in a vicinity of said channel area.

According to the semiconductor integrated circuit device of the present invention, even if the relative positions of the active semiconductor layer area and gate electrode are misaligned when they are formed, the channel areas of the paired transistors change while keeping the same shapes or their mutual mirror-image relationship. It is therefore possible to suppress the difference between the characteristics of the paired transistors, which is caused by the positional misalignment during fabrication, over a wafer or between wafers. This invention can thus manufacture semiconductor integrated circuit devices with high operation stability and high yield.

DETAILED DESCRIPTION OF THE PREFERRED EMBODIMENTS

Figure 6:
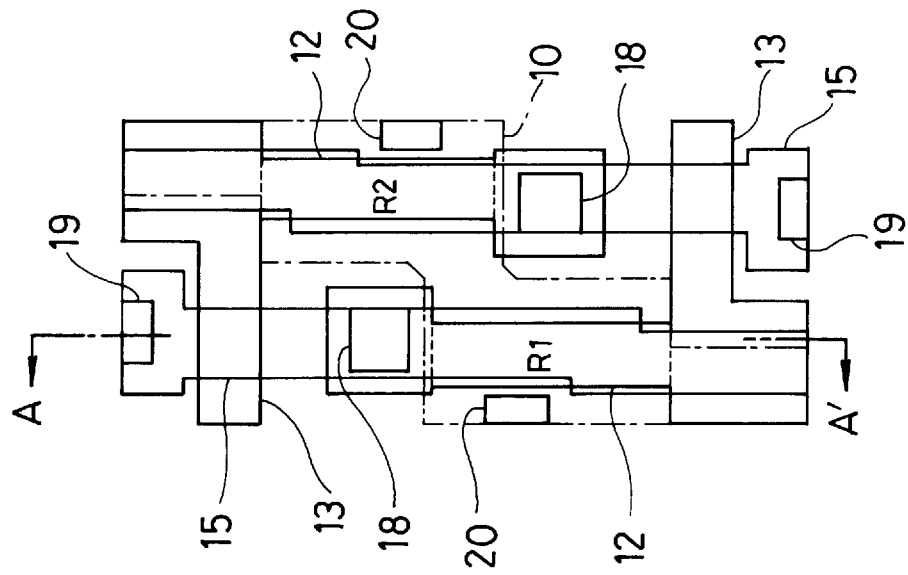
FIGS. 6A and 6B are plan views showing the layout of an SRAM cell according to the first embodiment of the present invention.
Figure 6:
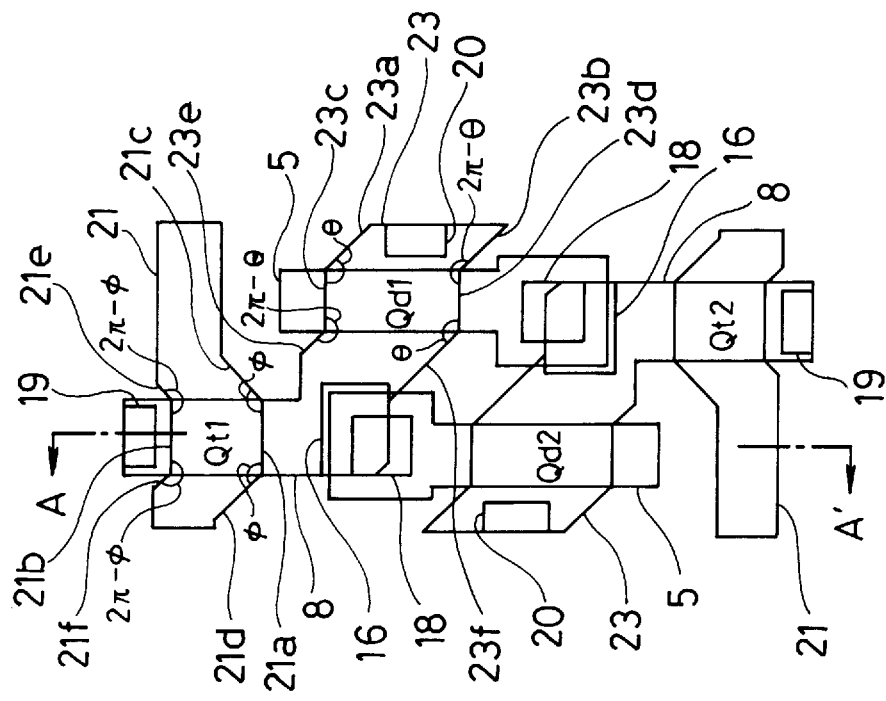

Preferred embodiments of the present invention will now be described with reference to the accompanying drawings. FIGS. 6A and 6B depict the layout of an SRAM cell in plan views according to the first embodiment of this invention. While FIGS. 6A and 6B present plan layout diagrams of an MOSFET section and a high-resistance element section, respectively, the high-resistance element section (FIG. 6B) is actually laid over the MOSFET section (FIG. 6A). Cells adjacent to this unit cell are equivalent to the unit cell mirror-reflected with respect to the long side and short side, respectively. Therefore, the adjoining cells share contact holes half of which are illustrated.

Figure 2A:
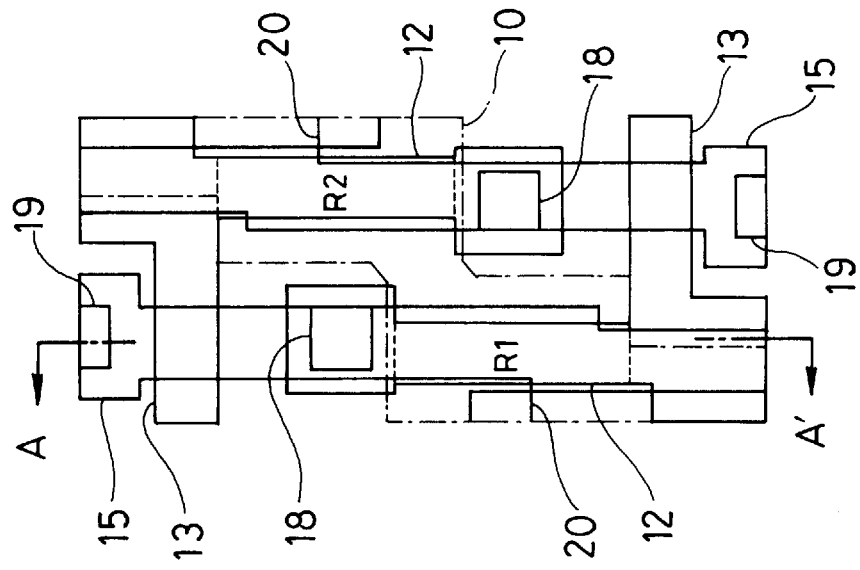
FIGS. 2A and 2B are plan views showing the layout of a conventional SRAM cell.
Figure 2B:
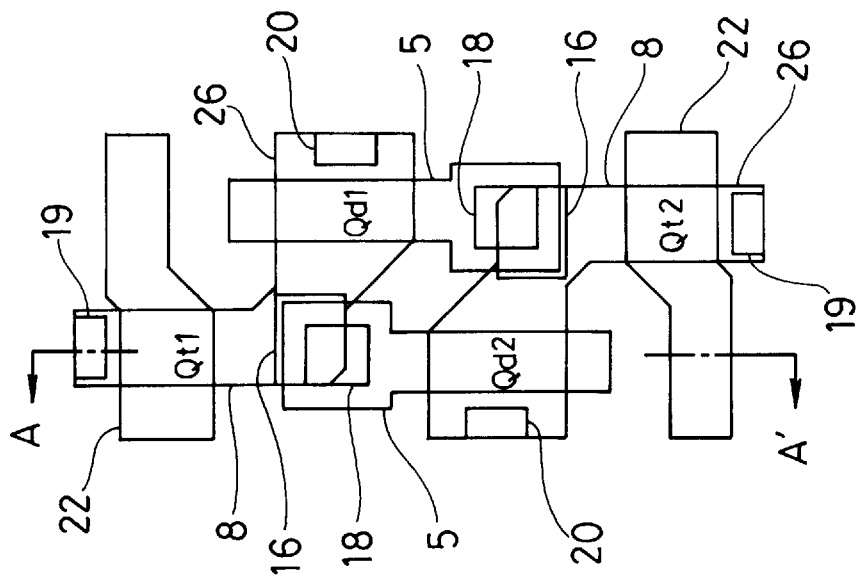
Figure 3:
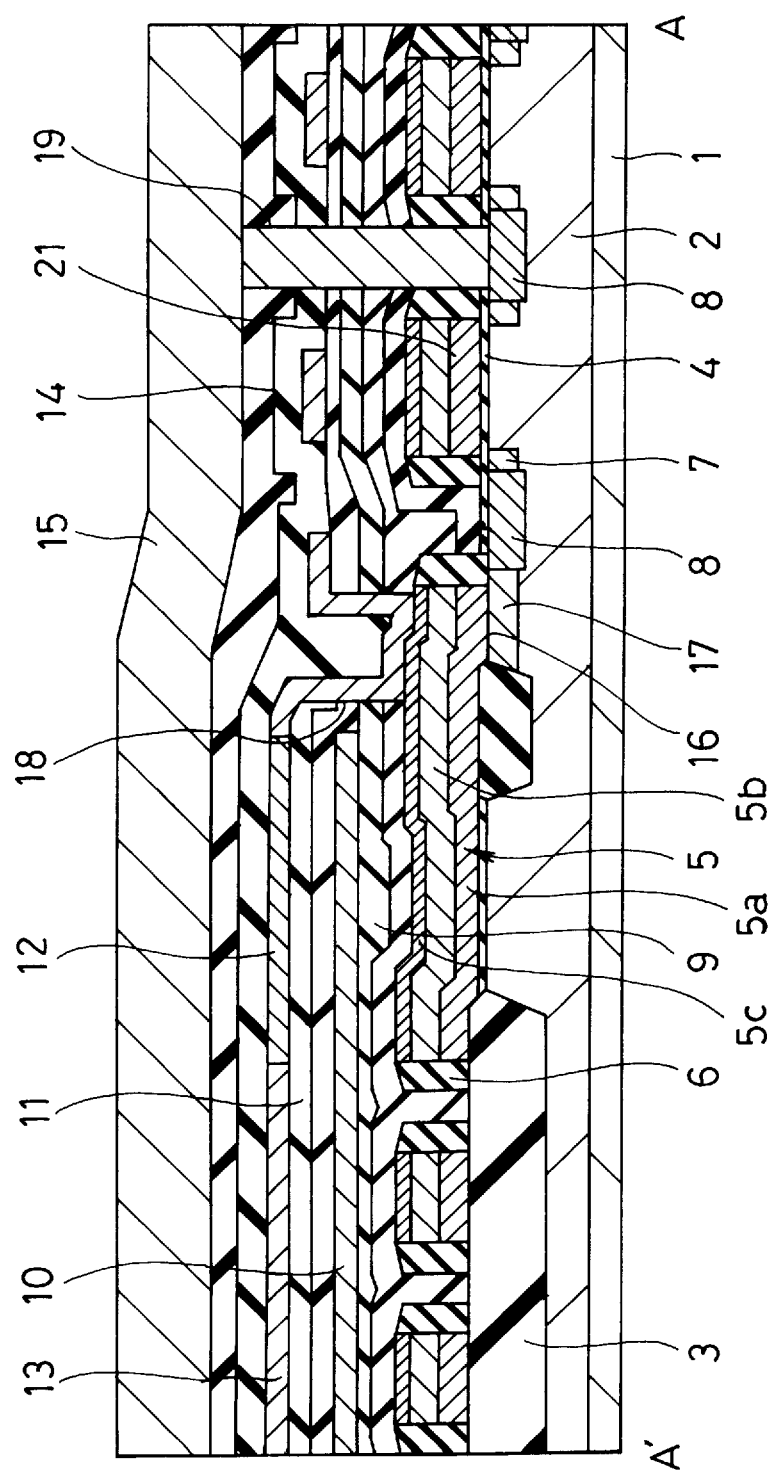
FIG. 3 is a cross-sectional view along the line A–A' in FIGS. 2A and 2B and FIGS. 6A and 6B.
Figure 4:
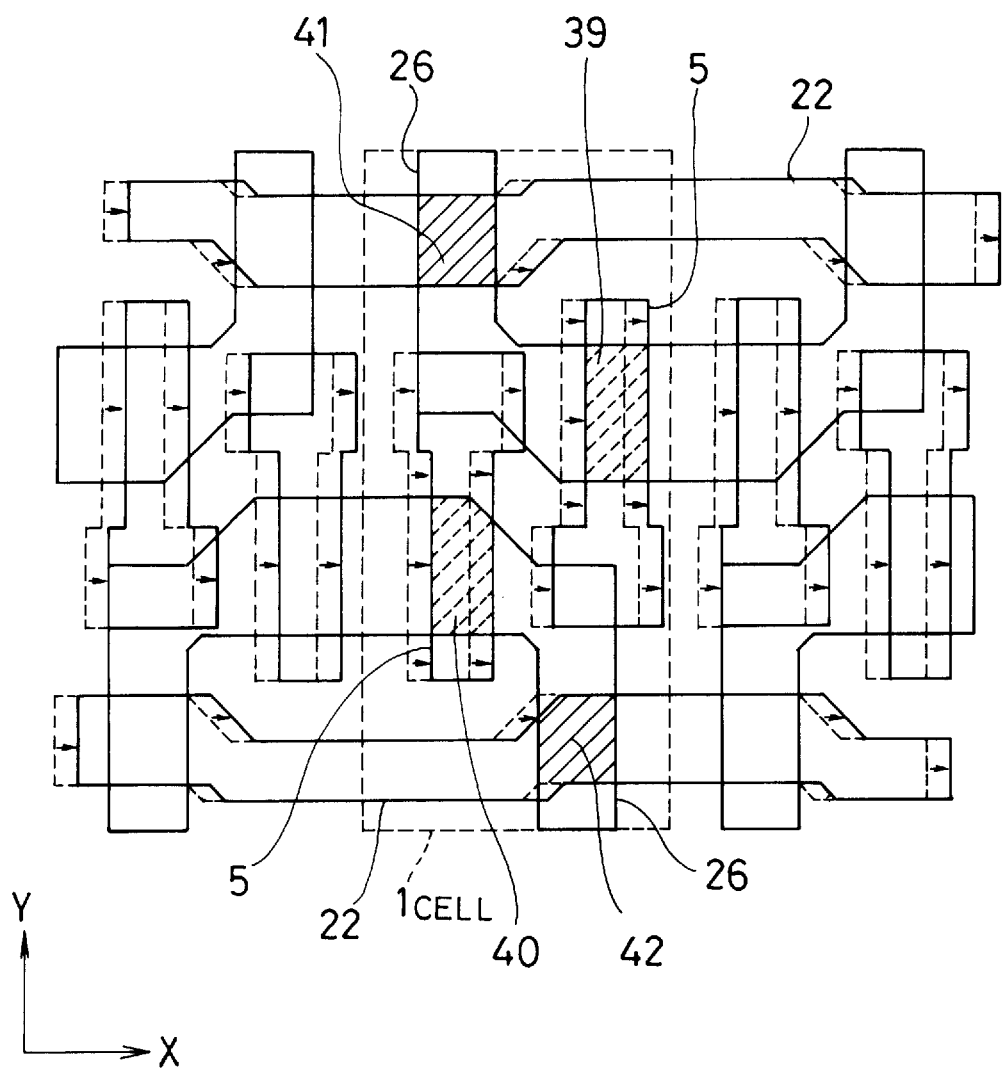
FIG. 4 is a layout diagram of an SRAM cell in a plan view for explaining the problems of prior art.
Figure 5:
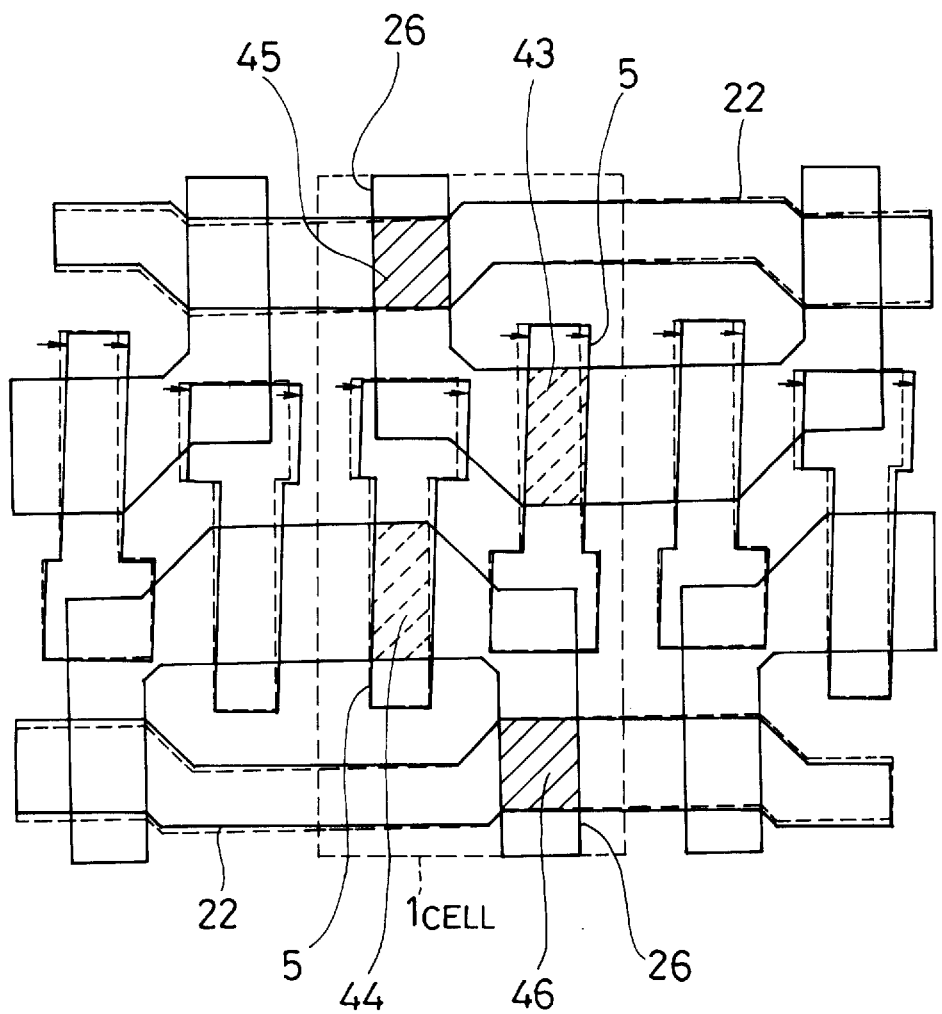
FIG. 5 is a layout diagram of an SRAM cell in a plan view for explaining the problems of the prior art.

The arrangement of the individual elements is the same as that of the prior art shown in FIGS. 2A and 2B. The cross-sectional views of FIGS. 6A and 6B along the line A–A' are the same as the cross-sectional view of FIG. 3 showing the prior art. Therefore, the descriptions of those corresponding portions will be omitted unless necessary.

According to this embodiment, as shown in FIGS. 6A and 6B, the source and drain areas and channel areas of a drive transistor Qd1 and a transfer transistor Qt1 in an SRAM cell are formed in an active area 23. The source and drain areas and channel areas of a drive transistor Qd2 and a transfer transistor Qt2 are likewise formed in the active area 23.

Field lines 23a and 23b which define the source area of the drive transistor Qd1 are in contact with field lines 23c and 23d which define the channel area of the transistor Qd1, at angles of θ and 2π-θ, respectively. θ is not 0° and 180°. Field lines 23e and 23f which define the drain area of the transistor Qd1 are likewise in contact with the field lines 23c and 23d, at angles of 2π-θ and θ, respectively. Further, the source area and drain area are formed in the vicinity of the channel area in a point symmetrical to the center of the channel area. The drive transistor Qd2 is formed in the same pattern.

Of the gate electrode (word line 21) of the transfer transistor Qt1, gate lines 21a and 21b which define the channel area are in contact with gate lines 21c and 21d and gate lines 21e and 21f, which extend over the device isolation area, at angles of φ and 2π-φ, respectively. Gate patterns (word line patterns) on both sides of the channel area are arranged in a line symmetrical to the channel area in the vicinity thereof. The transfer transistor Qt2 is formed in the same pattern as the transfer transistor Qt1. In this embodiment, θ and φ are set to 135 degrees.

Figure 7:
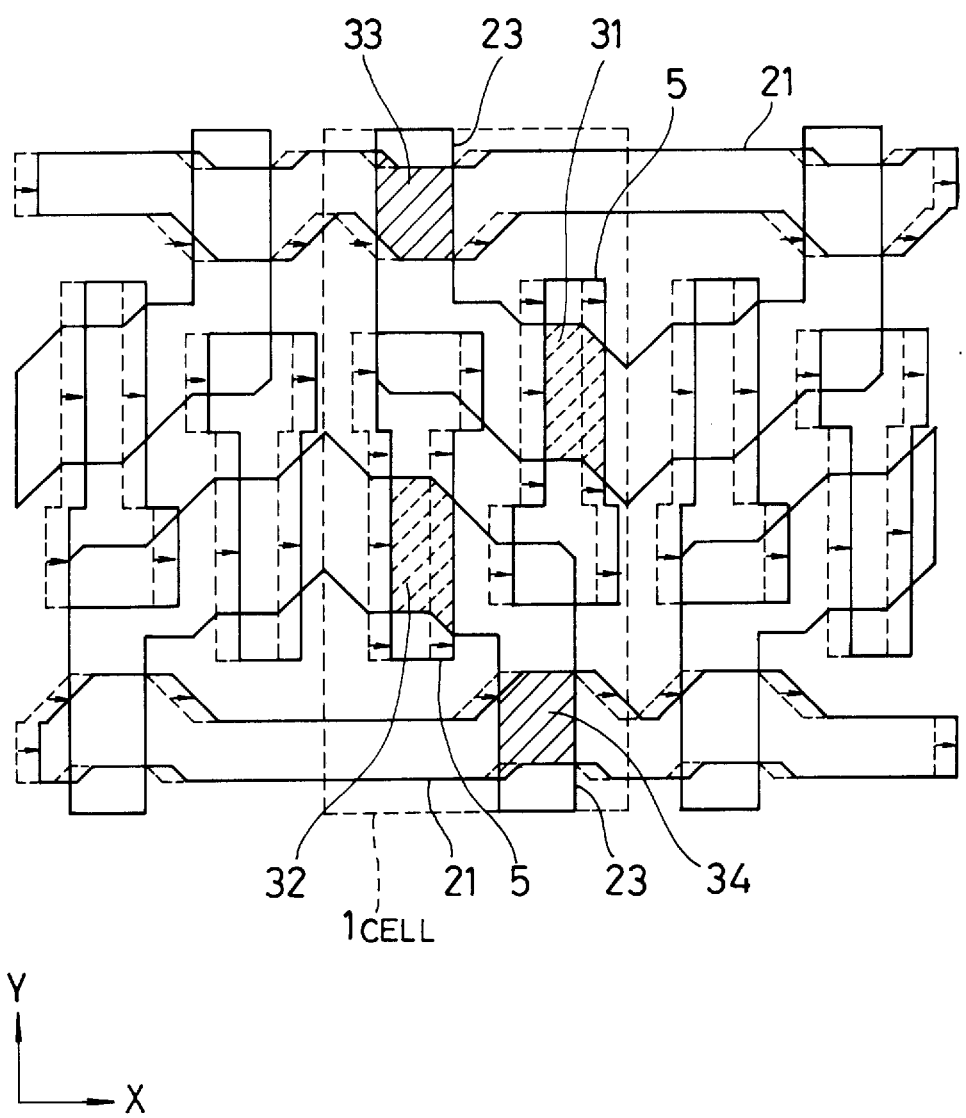
FIG. 7 is a layout diagram of an SRAM cell in a plan view for explaining the advantages of the first embodiment of this invention.

FIG. 7 is a plan layout diagram showing three cells, each having the pattern in FIG. 6A, aligned along the short side; a gate electrode 5 and word line 21 are shifted in the X direction with respect to the active area 23. FIG. 7 also illustrates the expected, unshifted gate (word line) pattern in broken lines. When the positional misalignment occurs, the planar shapes of channel areas 31 and 32 of a pair of drive transistors change from rectangular shapes to other shapes while their shapes are kept identical to each other. Likewise, channel areas 33 and 34 of a pair of transfer transistors change from rectangular shapes to other shapes while keeping their mirror-image relationship intact.

If a positional misalignment falls within a given range, the channel areas of the paired transistors deform in the same way so that the difference between the characteristics of the paired transistors is suppressed.

Figure 8:
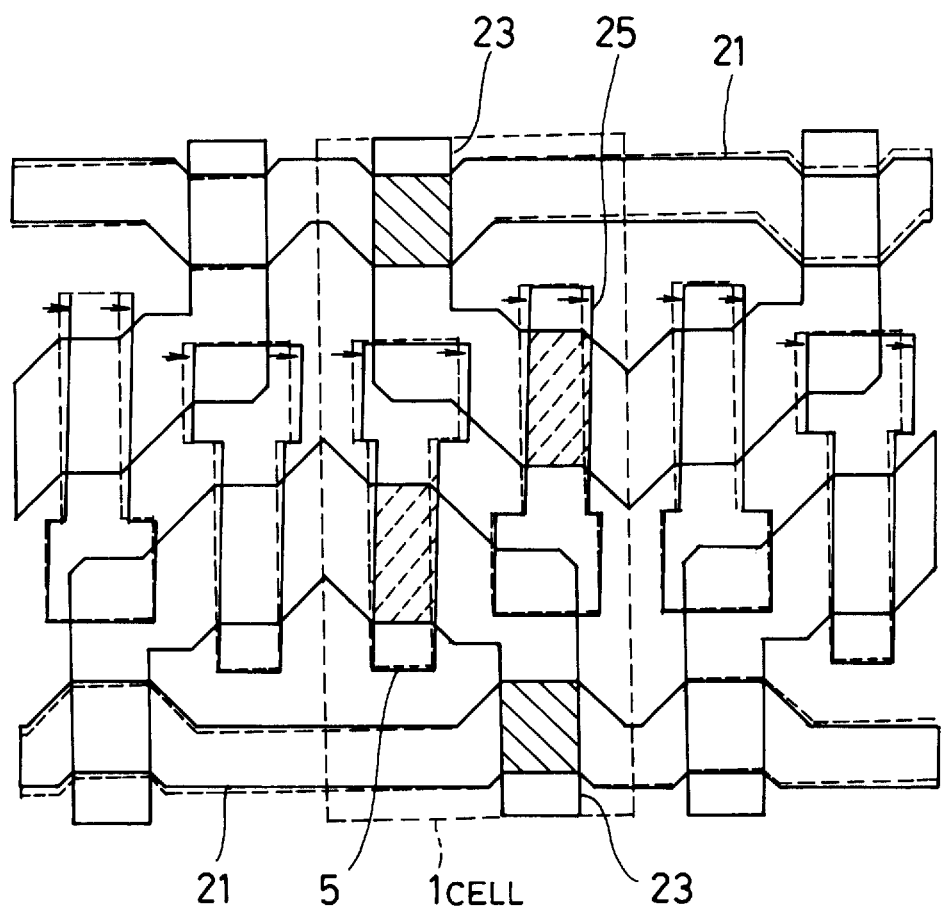
FIG. 8 is a layout diagram of an SRAM cell in a plan view for explaining the advantages of the first embodiment of this invention.

FIG. 8 illustrates the gate electrode 5 and word line 21 turned around a given point in the wafer in the direction of the arrows so that they are shifted with respect to the active area 23. In this case, although the channel areas are formed as indicated by the hatched areas, the difference between the channel areas of the paired drive transistors and the difference between the channel areas of the paired transfer transistors are smaller than those of the prior art, thus ensuring the suppressed difference between the transistor characteristics.

Figure 9:
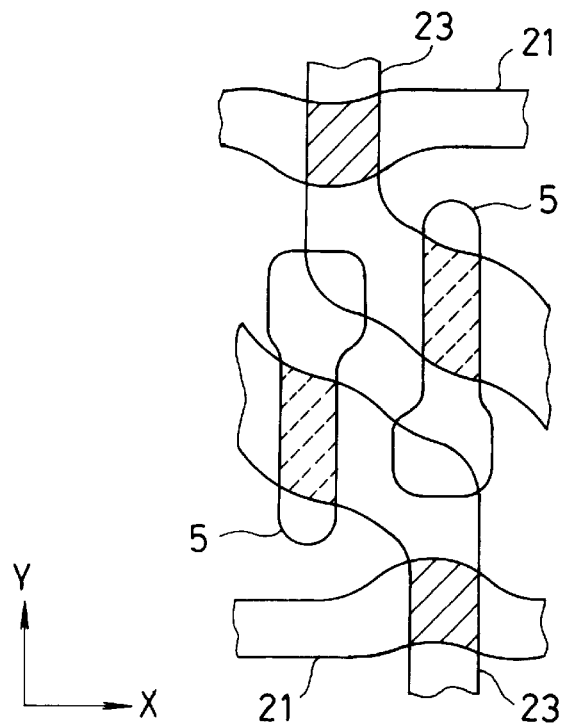
FIGS. 9A and 9B are plan views illustrating actual patterns on wafers according to the first embodiment of this invention and the prior art.
Figure 9:
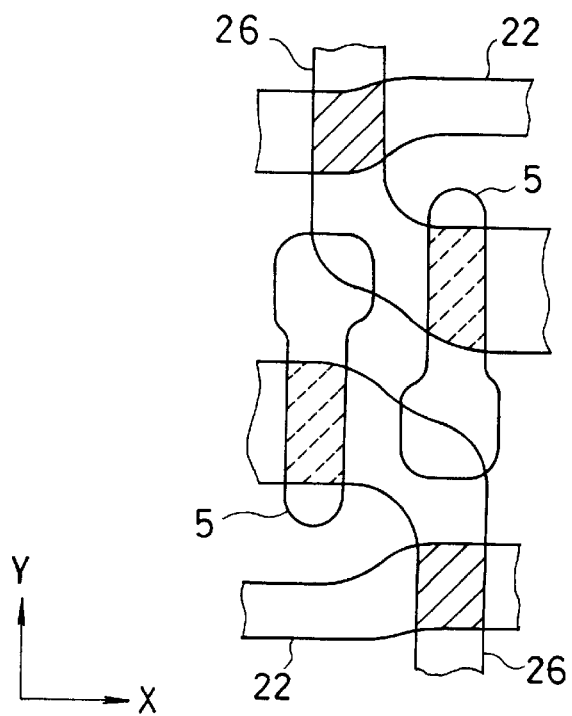

Although the layout of this embodiment shown in FIGS. 6A and 6B and the layout of the prior art shown in FIGS. 2A and 2B are on mask patterns, the actual pattern on a wafer partially includes a curved line at the bent portion of the pattern, as shown in FIGS. 9A and 9B, for example. FIG. 9A corresponds to the first embodiment of this invention, and FIG. 9B corresponds to the prior art, both illustrating the gate electrode 5 and word lines 21 and 22 misaligned in the X direction with respect to the active areas 23 and 26. The hatched portions in the diagrams represent the channel areas of the transistors. There occurs a difference between the shapes of the channel areas of the paired transistors even in the actual pattern according to the prior art (FIG. 9B), whereas such a difference hardly occurs in this embodiment (FIG. 9A).

The paired drive transistors in the first embodiment of this invention shown in FIGS. 6A and 6B and the paired drive transistors in the prior art shown in FIGS. 2A and 2B were formed with a positional misalignment of approximately 0.1 μm on the same wafer and the difference in ON current between each pair of transistors were measured. The prior art resulted in an ON current difference of approximately 6%, whereas this embodiment reduced the difference down to approximately 3.5%. From the viewpoint of computation, this improvement is equivalent to the reduction by about 0.3 V of the lower limit of the supply voltage on which the SRAM cell is operable. Moreover, there is data on the advantage of this embodiment such that a variation δ in the ON current difference in a wafer is reduced by approximately 15% in this embodiment as compared with the prior art.

Figure 10:
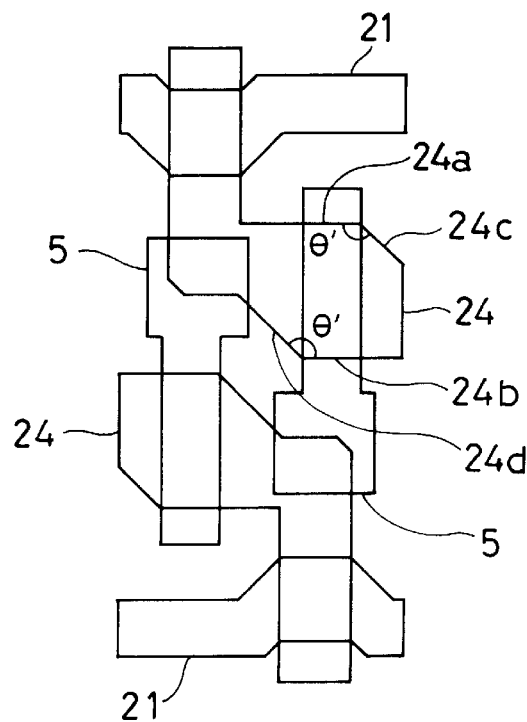
FIGS. 10A and 10B are plan views showing the layout of an SRAM cell according to the second embodiment of the present invention.
Figure 10:
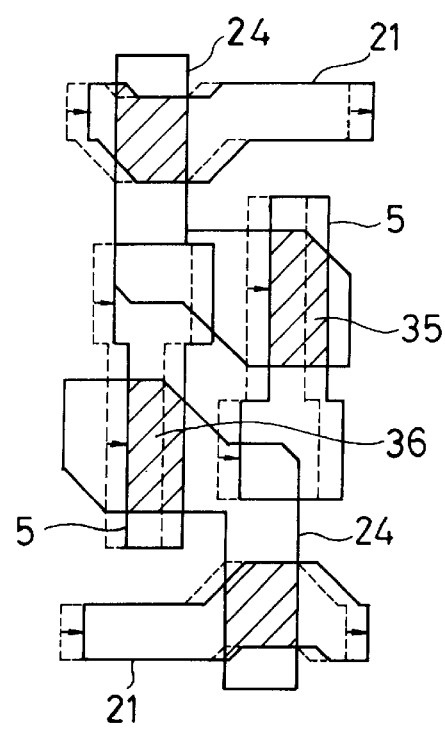

The second embodiment of this invention will now be described. FIG. 10A shows the layout of an MOSFET section of an SRAM according to the second embodiment of this invention. In this embodiment too, the high-resistance element section (not shown) is laid over the MOSFET section as in the case in FIG. 6B. This embodiment differs from the first embodiment shown in FIGS. 6A and 6B in that the shape of an active area 24 which defines the channel areas and source and drain areas of the drive transistors and transfer transistors is different from that of the first embodiment.

According to this embodiment, a field line 24c which defines the source area of the drive transistor is in contact with a field line 24a which defines the channel area of the drive transistor at an angle of θ'. A field line 24d, which defines the drain area of the drive transistor, is likewise in contact with a field line 24b, at an angle of θ'.

According to this embodiment, the inherent source area and drain area are formed in the vicinity of the channel area in a point symmetrical to the center of the inherent channel area.

Figure 11:
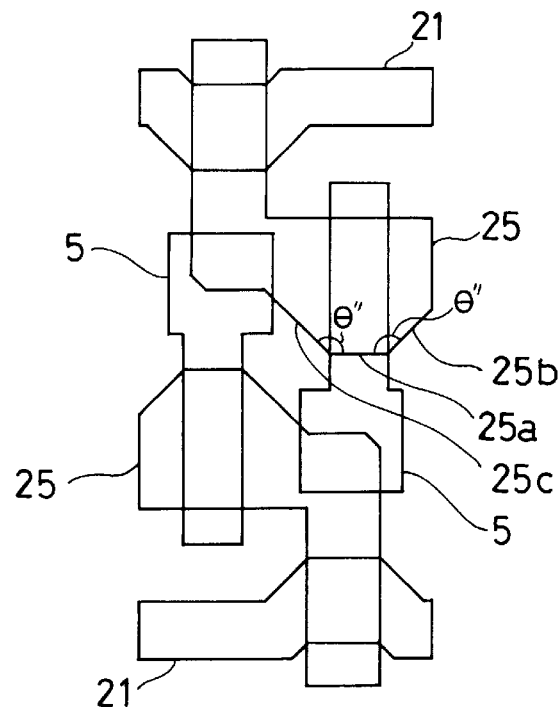
FIGS. 11A and 11B are plan views showing the layout of an SRAM cell according to the third embodiment of the present invention.
Figure 11:
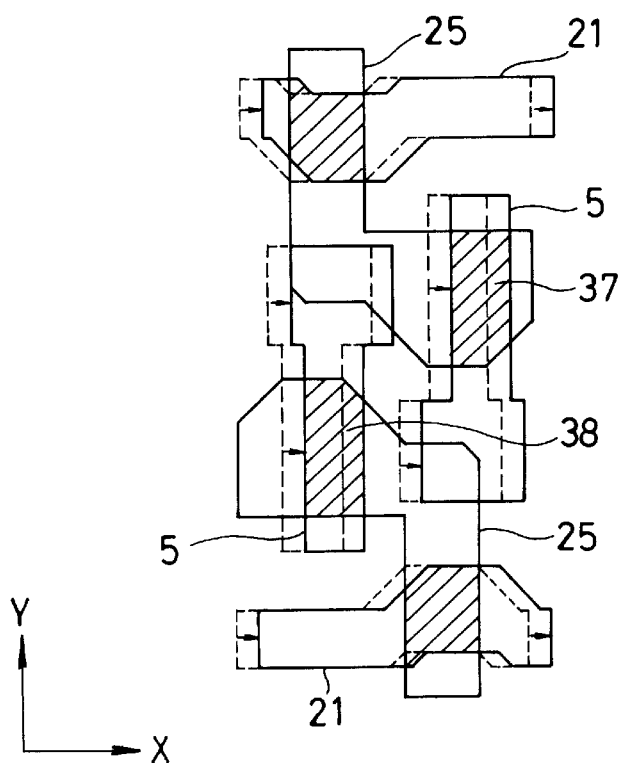

FIG. 10B illustrates the case where the gate electrode 5 and word line 21 are misaligned from the proper position shown in FIG. 10A with respect to the active area 24 in the X direction. In FIG. 10B, the channel areas of the transistors are represented by the hatched portions and the shapes of channel areas 35 and 36 change to the same shape in this embodiment too, thus suppressing the occurrence of the difference between the characteristics of the paired drive transistors which is caused by the positional misalignment. With regard to the paired transfer transistors, what is applied to the first embodiment is also applied to this embodiment. The third embodiment of this invention will now be described. FIG. 11A shows the layout of an MOSFET section of an SRAM according to the third embodiment of this invention. In this embodiment too, the high-resistance element section (not shown) is laid over the MOSFET section as in the case in FIG. 6B. This embodiment differs from the first and second embodiments in that the shape of an active area 25 which defines the channel areas and source and drain areas of the drive transistors and transfer transistors is different from those of the first and second embodiments.

According to this embodiment, a field line 25b which defines the source area of the drive transistor is in contact with a field line 25a, which defines the channel area of the drive transistor, at an angle of θ". A field line 25c, which defines the drain area of the drive transistor, is likewise in contact with the field line 25a at an angle of θ".

According to this embodiment, the inherent source area and drain area are formed in the vicinity of the channel area in a line symmetrical to the center of the inherent channel area.

FIG. 11B illustrates the case where the gate electrode 5 and word line 21 are misaligned from the proper position shown in FIG. 11A with respect to the active area 25 in the X direction. In FIG. 11B, the channel areas of the transistors are represented by the hatched portions and the shapes of channel areas 37 and 38 change to the same shape in this embodiment too, thus suppressing the occurrence of the difference between the characteristics of the paired drive transistors which is caused by the positional misalignment.

Figure 1A:
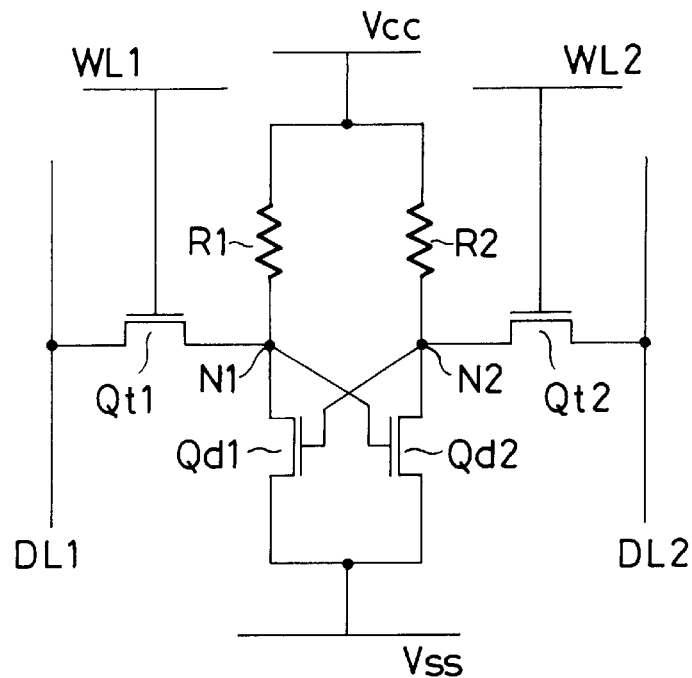
FIGS. 1A and 1B are equivalent circuit diagrams of an SRAM cell.
Figure 1B:
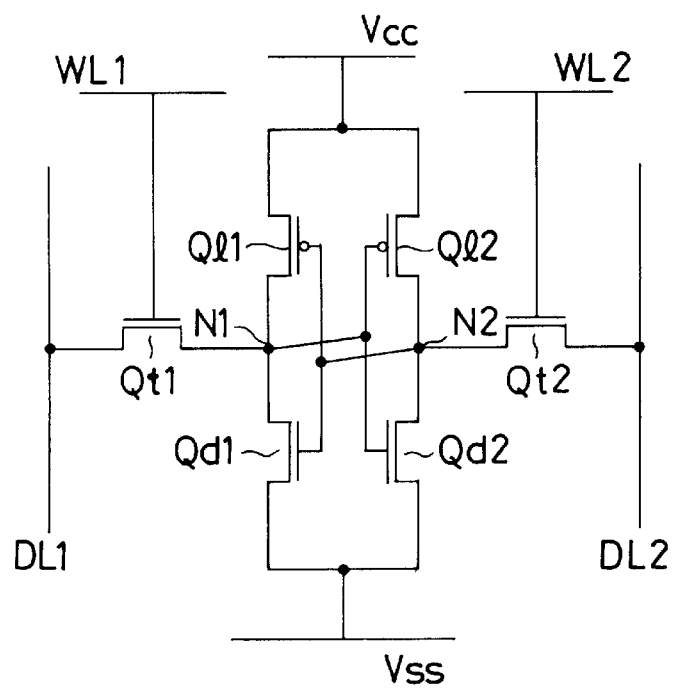

The fourth embodiment of this invention will be described below with reference to FIGS. 12A, 12B, 13, 14 and 1B. In this embodiment, an SRAM cell is comprised of p channel thin film transistors (each hereinafter referred to as "TFT") as load elements. The circuit diagram of this embodiment is illustrated in FIG. 1B. TFTs Q11 and Q12 have source terminals connected to a voltage supply $V_{CC}$ and drain terminals respectively connected to nodes N1 and N2. The gate terminal of one of the TFTs Q11 and Q12 is connected to the drain terminal of the other TFT, i.e., the gate terminals of the TFTs Q11 and Q12 are connected to the nodes N2 and N1, respectively.

Figure 12:
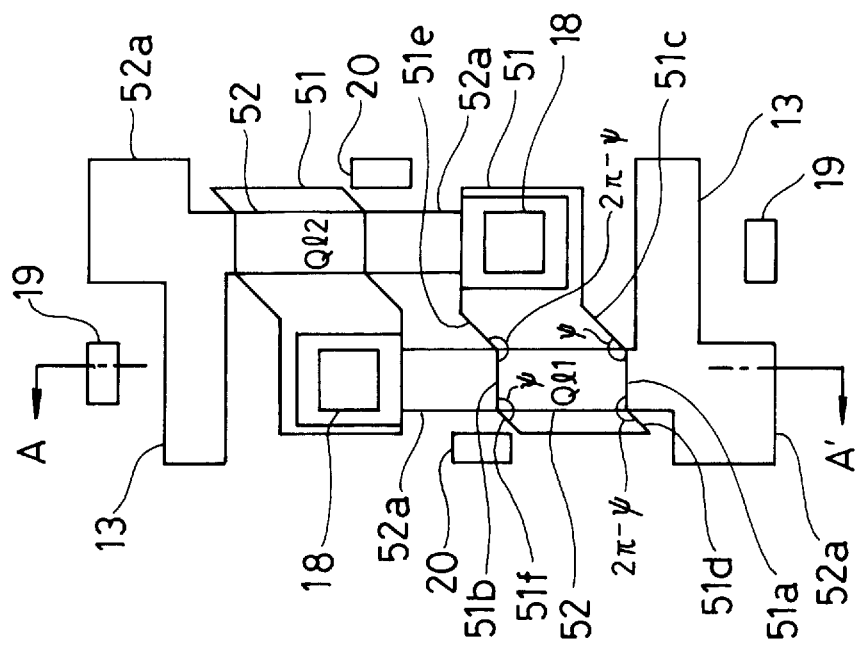
FIGS. 12A and 12B are plan views showing the layout of an SRAM cell according to the fourth embodiment of the present invention.
Figure 12:
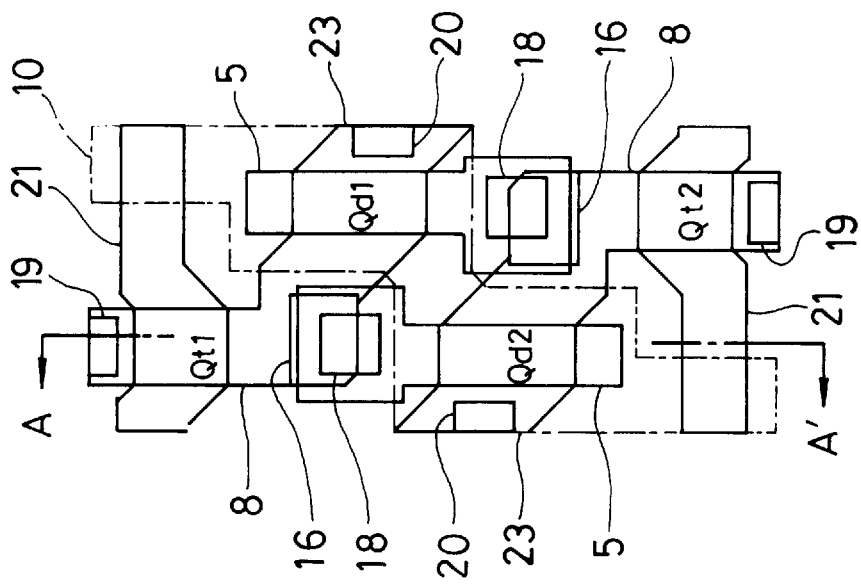

FIGS. 12A and 12B are plan layout diagrams of a unit cell using TFTs as load elements. Although the MOSFET section (FIG. 12A) and the TFT section (FIG. 12B) are separated depicted, the TFT section (FIG. 12B) is actually laid over the MOSFET section (FIG. 12A). In this embodiment, the MOSFET section is constituted in the same way as the MOSFET section of the first embodiment shown in FIG. 6A.

Cells adjacent to this unit cell are equivalent to the unit cell mirror-reflected with respect to the long side and short side, respectively. Therefore, the adjoining cells share contact holes half of which are illustrated. Although data lines are not shown in those diagrams, the layouts are the same as are illustrated in FIGS. 6A and 6B.

As shown in FIG. 12B, each of the TFTs Q11 and Q12 has a gate electrode 51 directly below which a channel area is formed to provide a top gate structure. More specifically, a polycrystalline silicon layer 52 is formed below the gate electrode 51, a channel area is formed in a portion of the layer 52 which lies directly below the gate electrode 51, and an impurity is injected into the other portion of the layer 52 to form a low-resistance polycrystalline silicon layer 52a. The low-resistance polycrystalline silicon layer 52a is an area where the source and drain areas of the TFTs Q11 and Q12 are to be formed, and one of the source and drain areas of one TFT serves as a voltage supply line 13 extending along the short side of the cell while the other is connected via a contact hole 18 to the gate electrode 5 of the other TFT and the gate electrode 5 of the drive transistor.

With regard to the gate electrode 51 of the TFT Q11, gate lines 51a and 51b which define the channel area are in contact with gate lines 51c and 51f, which define the gate wire pattern, at an angle of ψ, and are in contact with gate lines 51d and 51e, which also define the gate wire pattern, at an angle of 2π-ψ. Gate wire patterns on both sides of the channel area are formed in the vicinity of the channel area in a point symmetrical to the channel area. The TFT Q12 is constituted in the same pattern.

Figure 13:
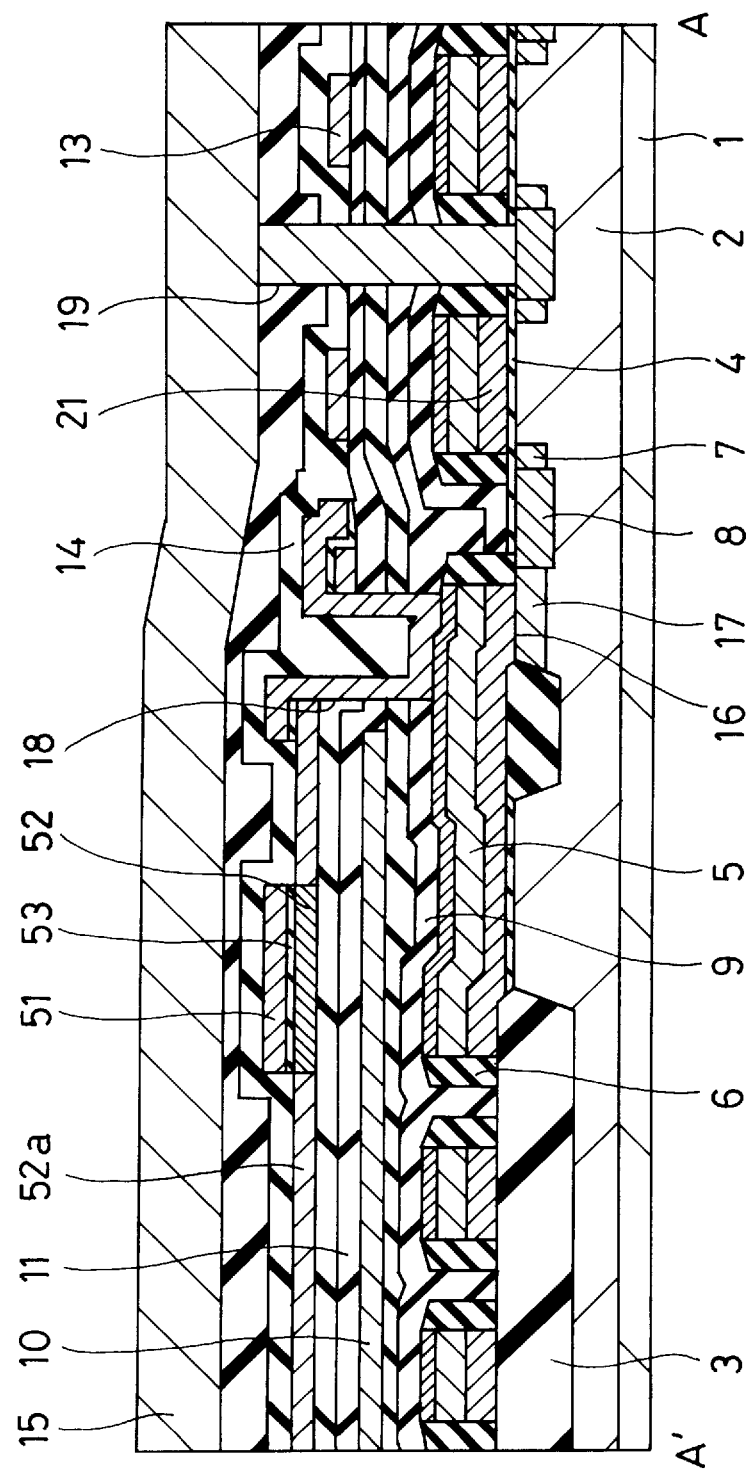
FIG. 13 is a cross-sectional view along the line A–A' in FIGS. 12A and 12B.

FIG. 13 is a cross-sectional view along the line A–A' in FIGS. 12A and 12B. A p type well 2 with an impurity concentration of approximately $10^{16}$ to $10^{17}$ cm$^{-3}$ is formed in the memory-cell forming area on an n type silicon substrate 1 with an impurity concentration of approximately $10^{15}$ cm$^{-3}$. Components from a field oxide film 3 to a ground line 10 are formed in order on the surface of the p type well 2 in the same procedures as are performed in the prior art. Thereafter, a polycrystalline silicon layer 52 is formed 50 to 100 nm thick over the ground line 10 via an insulating film 11, a gate oxide film 53 of the associated TFT is formed 10 to 30 nm thick on the layer 52, and a gate electrode 51 of the associated TFT, made of a polycrystalline silicon film, is formed 50 to 150 nm thick on the gate electrode 53.

The polycrystalline silicon layer 52, which will serve as the channel area and source and drain areas of the associated TFT is formed by annealing amorphous silicon at 500° to 600° C. in order to increase the grain size and improve the electric characteristics of the TFT. The low-resistance polycrystalline silicon layer 52a, which will serve as the source and drain areas and the supply voltage line 13, is formed by injection of impurity ions with the gate electrode 51 used as a mask. A data line 15 of aluminum is formed on the TFT via an insulating film 14. The data line 15 is connected via a contact hole 19 to an n$^+$ type diffusion layer.

Figure 14:
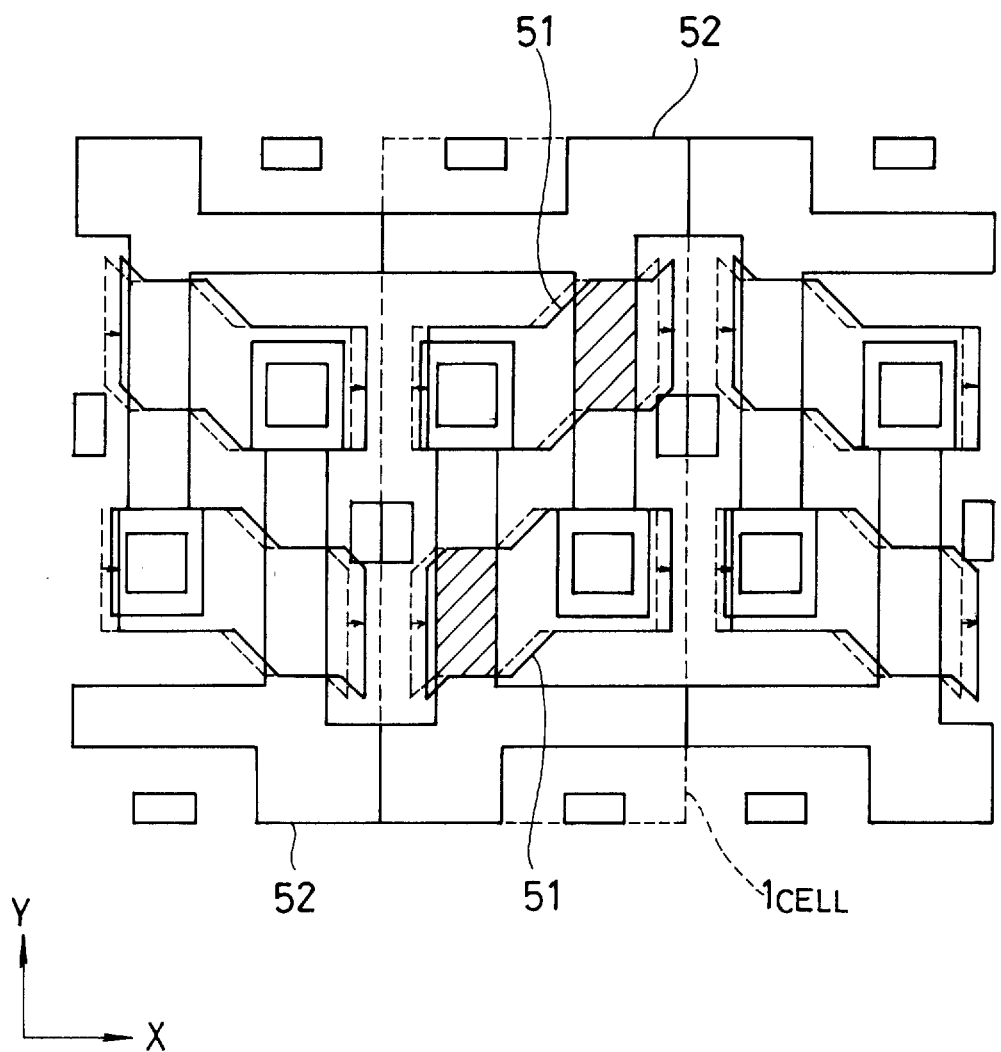
FIG. 14 is a layout diagram of an SRAM cell in a plan view for explaining the advantages of the fourth embodiment of this invention.

FIG. 14 is a plan layout diagram showing three cells 1, each having the pattern in FIG. 12B, aligned along the short side. FIG. 14 illustrates, in solid lines, the pattern of the gate electrode 51 shifted in the X direction with respect to the pattern of the polycrystalline silicon layer 52 where the channel area and source and drain areas are to be formed. In the diagram, the broken lines indicate the expected positions. The channel areas of paired TFTs in the cell are formed as indicated by the hatched portions in the diagram. That is, the channel areas of both transistors are deformed in the same shape, so that if the positional misalignment falls within a given range, it is possible to suppress the difference between the characteristics of the paired TFTs which is originated from the positional misalignment.

According to this embodiment, the drive transistors and transfer transistors to be formed on the surface of the substrate are constituted in the same way as those of the first embodiment. In addition to the advantages of the previous embodiment, therefore, the difference between the characteristics of the paired TFTs which are formed on the top layer can be reduced, thus ensuring higher stability of the SRAM cell against the positional misalignment.

What is claimed is:

1. A semiconductor integrated circuit device comprising at least one pair of field effect transistors, each having a gate electrode and an active semiconductor layer area having a channel area with source and drain areas and intersecting said gate electrode, and a planar shape of said channel area being a rectangular shape subject to deteriorating to another shape responsive to a positional misalignment of said gate electrode and said active semiconductor layer area, said shapes of said channel areas of both transistors in said pair being identical to each other or mirror images of each other when there is said positional misalignment; one of said gate electrode and said active semiconductor layer area being formed linearly in a vicinity of said channel area, and the other of said gate electrode and said active semiconductor layer area having a side defining a channel area at an angle of other than 180 degrees from an adjacently connected side, and the other of said gate electrode and said active semiconductor layer having a shape symmetrical with respect to a center point or symmetrical to a center line of said channel area in a vicinity of said channel area.

2. The semiconductor integrated circuit device according to claim 1, wherein said angle other than 180 degrees is 135 degrees.

3. A semiconductor integrated circuit device comprising a pair of field effect transistors operating as one pair, each of said transistors having a gate electrode and an active semiconductor layer area having a channel area and source and drain areas, and intersecting said gate electrode, a planar shape of said channel area of said pair of transistors being polygons identical to each other or mirror images of each other when there is a positional misalignment between said gate electrodes and said active semiconductor layer areas; said gate electrodes have linear sides forming said channel areas, and said active semiconductor layer areas have sides forming said channel areas and bending at boundaries of channel areas at an angle of other than 90 degrees.

4. The semiconductor integrated circuit device according to claim 3, said active semiconductor layer areas have linear sides forming said channel areas, and said gate electrodes have sides forming said channel areas and bending at boundaries of channel areas at an angle of other than 90 degrees.

* * * * *